United States Patent [19]

Clements

[11] Patent Number: 5,449,917
[45] Date of Patent: Sep. 12, 1995

[54] METHOD AND APPARATUS FOR FORMING A PLURALITY OF TRACKS IN A FLEXIBLE WORKPIECE WITH A HIGH ENERGY PARTICLE

[75] Inventor: James G. Clements, Stratham, N.H.

[73] Assignee: Costar Corporation, Cambridge, Mass.

[21] Appl. No.: 226,390

[22] Filed: Apr. 12, 1994

Related U.S. Application Data

[63] Continuation of Ser. No. 832,000, Feb. 6, 1992, abandoned.

[51] Int. Cl.[6] .................................. H01J 27/00
[52] U.S. Cl. ........................... 250/492.3; 250/400
[58] Field of Search ................ 250/492.3, 492.1, 398, 250/400

[56] References Cited

U.S. PATENT DOCUMENTS

| | | | |
|---|---|---|---|
| 2,914,450 | 11/1959 | Hammesfahr et al. | 250/492.3 |
| 3,303,085 | 2/1967 | Price et al. | 156/644 |
| 3,330,748 | 7/1967 | Lawton | 250/492.3 |
| 3,564,238 | 2/1971 | Martin et al. | 250/492.3 |
| 3,676,249 | 7/1972 | Lemelson | 250/492.3 |
| 3,677,844 | 7/1972 | Fleischer et al. | 156/644 |
| 3,852,134 | 12/1974 | Bean | 250/472.1 |
| 3,888,753 | 6/1975 | Kiikka et al. | 250/492.3 |
| 3,911,281 | 10/1975 | Ihme | 250/492.3 |
| 4,956,219 | 9/1990 | Legras et al. | 428/137 |

FOREIGN PATENT DOCUMENTS

0109147 5/1984 European Pat. Off. .

OTHER PUBLICATIONS

2Lück et al., "Production of Particle-Track Membranes by Means of a 5 MV Tandem Accelerator," Nuclear Instruments & Methods in Physics Research pp. 395–400.
Rogers, E. "Optimal Selection of Sweep Frequencies in Ion Implantation Systems with X-Y Scanning," Nuclear Instruments & Methods, 189 (1981) 305–310.
Roth, A., Vacuum Sealing Techniques, Pergamon Press, p. 709 (1966).
Spohr, R., Ion Tracks at Microtechnology, Friedr. Vieweg and Sohn Verlagagsell Schaft mbH, Braunschweig, pp. 14–48, (1990).
Tretyakova et al., "A study of the Registration Properties of Polyethylene Terephthalate," Proc. 10th Int. Conf. on SSNTD's, Lyon, Jul., 1989 (ed. Francois et al.), Pergamon Press, Oxford, pp. 283–289.
Turner, N., "Improved Uniformity of Implanted Dose by a Compensated Scan Pattern Generator," Nuclear Instruments and Method, vol. 189 (1981), pp. 311–318.
C. A. Abramyan, "Electron Processing in the USSR," Radiat. Phys. Chem. vol. 14, pp. 127–140, Pergamon Press Ltd. (1979).
"Characteristics of Submicron Pores Obtained by Chemical Etching of Nuclear Tracks and Polycarbonate Film," by G. Guillot and F. Rondelez *Journal of Applied Physics*, vol. 52, No. 12, Dec. 1981, pp. 7164–947.
"Eine Bestrahlungsanlage Fur Polienmaterial," M. Matthes, W. Pfosterf and N. Seidal, *Gemeinsamer Jahresbericht*, Jun. 1984. (English translation included).
"Production in Use of Nuclear Tracks: Imprinting Structure on Solids" B. E. Fischer and Reimar Spohr, *Reviews of Modern Physics*, vol. 55, No. 4, Oct. 1983.
"Practical Applications of Heavy Ion Beams," Flerov et al., *Soc. Phys. USP.*, vol. 17, No. 5, (Mar.–Apr. 1975), pp. 783–793.
"On the Technology of Manufacturing Microfilters with Higher Specific Efficiency," Flerov et al., *Atomnaya Energlya*, USSR (1983) vol. 53, No. 3, p. 181 et sequence. (English translation included).
"Measurements of the Diameter of Selectively Etchable Tracks Produced in Polymer by Heavy Ions," E. U. Apel, *Nuclear Tracks*, vol. 6, No. 2–3, pp. 115–118, 1982.

Primary Examiner—Jack I. Berman
Assistant Examiner—Kiet T. Nguyen
Attorney, Agent, or Firm—Wolf, Greenfield & Sacks

[57] ABSTRACT

The present invention features methods and apparatus for forming a plurality of tracks in a foil or film with high-energy charged particles by forming layers.

23 Claims, 2 Drawing Sheets

METHOD AND APPARATUS FOR FORMING A PLURALITY OF TRACKS IN A FLEXIBLE WORKPIECE WITH A HIGH ENERGY PARTICLE

This application is a continuation of application Ser. No. 07/832,000, filed Feb. 6, 1992 abandoned.

INTRODUCTION

The present invention relates to methods and apparatus for forming tracks in a flexible workpiece with high-energy particles traveling along a trajectory path and, in particular, to methods and apparatus for forming a plurality of tracks in a flexible film or foil with each high-energy particle.

BACKGROUND OF THE INVENTION

High-energy particles have been used to create tracks and perforations in films and foils. The films and foils may be subjected to etchants which act on the damaged track area of the films and foils to make or adjust the size of the track and perforations. Such films and foils have many applications including, without limitation, filters and molecular sieves.

The use of high-energy particles to produce tracks in substrates is disclosed in several references. By way of example, U.S. Pat. No. 3,303,085, to P. E. Price et al., entitled MOLECULAR SIEVES AND METHODS FOR PRODUCING SAME, discloses the use of charged particles to produce articles having openings or apertures.

U.S. Pat. No. 3,677,844, to R. L. Fleischer et al., entitled PROCESS FOR MAKING AN ELASTIC STRETCHY SHEET CONTAINING APERTURES HAVING A DIAMETER OF AT LEAST FIVE ANGSTROMS AND BEING SUITABLE AS A MOLECULAR SIEVE, discloses the use of a combined etchable polymer and unetchable polymer, subjected to high-energy particles, which high-energy particles form substantially straight tracks of damaged copolymer. The aperture containing polymer includes properties usually associated with the nonetchable polymer to which it is bound.

U.S. Pat. No. 3,852,134, to C. P. Bean, entitled METHOD FOR FORMING SELECTIVELY PERFORATE BODIES, discloses methods for forming a selectively perforate membrane suitable for high-resolution screen printing by radiating a sheet of synthetic resin with heavy fission fragments.

In an article entitled "Characteristics of Submicron Pores Obtained by Chemical Etching of Nuclear Tracks and Polycarbonate Film," G. Guillot and F. Rondelez disclose a method and apparatus for producing pore perforations in solid material in sheet form with an isochronous cyclotron. The article appeared in the *Journal of Applied Physics*, Vol. 52, No. 12, December 1981, pages 7164-947.

M. Matthes, W. Pfosterf and N. Seidal, report in an article entitled "Eine Bestrahlungsanlage Für Polienmaterial," an apparatus for producing perforations in solid material in sheet form with an accelerato. The apparatus features a tank or high vacuum chamber adapted to contain a handler. The handler is adapted for handling a material for treatment by the accelerator and in particular comprises a spool of nonbombarded material, a mandrel for winding the material after it has been bombarded and guide rollers. The article appeared in the publication *Gemeinsamer Jahresbericht*, June 1984.

In a review article entitled "Production and Use of Nuclear Tracks: Imprinting Structure on Solids," Fischer and Spohr discuss apparatus and methods for producing perforations in solid material in sheet form with accelerators. The device and methods of Fischer and Spohr feature various handlers for handling material in a continuous process. The article appeared in the publication *Reviews of Modern Physics*, Vol. 55, No. 4, October 1983.

In a series of articles, Flerov et al. disclose devices and methods for forming perforations in solid materials in sheet form with accelerators. The articles are entitled, "Practical Applications of Heavy Ion Beams," appearing in the *Sov. Phys. USP.*, Vol. 17, No. 5 (March-April 1975), pages 783-793; and "On the Technology of Manufacturing Microfilters with Higher Specific Efficiency," appearing in *Atomnaya Energlya*, USSR (1983) Vol. 53, No. 3 p. 181 et sequence.

E. U. Apel discloses in an article, entitled "Measurements of the Diameter of Selectively Etchable Tracks Produced in Polymer by Heavy Ions," methods and apparatus for producing perforations in solid materials. The article appeared in *Nuclear Tracks*, Vol. 6, No.2-3 pp. 115-118, 1982.

U.S. Pat. No. 4,956,219, to Legras et al., entitled METHOD OF PRODUCING PERFORATIONS IN A SOLID MATERIAL IN SHEET FORM, AN IRRADIATION DEVICE FOR WORKING THE METHOD, AND THE RESULTING PERFORATED MATERIAL, discloses a method of, and apparatus for, producing perforations in solid material in sheet form with a isochronous cyclotron. An isochronous cyclotron is an apparatus for producing high-energy charged particles. The device and methods of the Legras et al. reference feature a high-vacuum chamber through which particles pass, a tank adapted to contain a handler, and a diaphragm separating the chamber from the tank. The handler is adapted for handling a material for treatment by the isochronous cyclotron. In particular, the handler comprises a spool of nonbombarded material, a mandrel for winding the strip after it has been bombarded, and guide rollers and drive means for advancing the strip of material.

European Patent Application No. 83305268.1, Publication No. 0109147, to Varian Associates, Inc., entitled CHARGED PARTICLE BEAM LITHOGRAPHY MACHINE INCORPORATING LOCALIZED VACUUM ENVELOPE, teaches the use of charged particle beam lithography with localized vacuum processing.

Devices for performing bombardment of materials with high-energy particles are well known and have applications in research and industry. All devices for accelerating charged particles employ an electric field. Accelerators may differ in the way the electric field is produced and the manner in which the field acts on the particles. The high-energy charged particles produced by each accelerating type are identical for a given ion and energy.

Accelerators are generally classified as falling within two types—electrostatic accelerators and high frequency accelerators. Van de Graaf accelerators and Tandem accelerators are examples of electrostatic accelerators. Electrostatic accelerators are generally capable of producing energies of between 10 KeV and 10 MeV.

High frequency accelerators are characterized by an ion beam which encounters the same acceleration voltage several times. High frequency accelerators are generally classified into two sub-types—linear accelerators and cyclic accelerators. Linear accelerators employ a linear array of gap electrodes to accelerate a successive passage of ions. A Wideroe and Alvarez accelerator is an example of a linear accelerator.

Cyclic accelerators employ magnetic deflection for recycling particles through an accelerating gap subject to high frequency voltage. Cyclotrons and synchrotrons are examples of cyclic accelerators. Cyclic accelerators are capable of producing energies between 10 MeV and a few GeV, but may attain even higher energies.

Devices for performing bombardment with high-energy charged particles are expensive to operate. Efficient processing of materials with high-energy charged particles is therefore necessary.

SUMMARY OF THE INVENTION

Embodiments of the present invention feature methods and apparatus for forming a plurality of tracks in a flexible workpiece with a high-energy particle. Embodiments of the present inventions are suitable for use with any means for generating high-energy charged particles, and in particular, isochronous cyclotrons.

One embodiment of the present method comprises the steps of flexing a workpiece to form a plurality of layers which layers are capable of traversing the path of trajectory of the high-energy particles. The method includes the step of exposing the layers to at least one high-energy particle by placing the layers into the trajectory path. The high-energy particle passes through the layers of the workpiece to form a plurality of tracks.

Preferably, the workpiece can be film or foil. Films having particular application in the present invention include film of synthetic materials, such as polymers. Examples of preferred flexible films include such polymers as polyolefins, including polyethylene such as polyethylene terephthalate, polypropylene and polycarbonates, polystyrenes, aromatic polyethers, polysulfones, vinyl plastics such as polyvinylidene diflouride, and cellulose esters such as nitrate, acetate, and bytrate.

One embodiment of the present method features a step of layering the flexible workpiece by flexing means, capable of flexing the flexible workpiece to traverse the path of the high-energy particle two or more times.

One preferred form of flexing means comprises rollers or guides adapted to receive a workpiece such as film or foil and flex the workpiece in a festoon or serpentine arrangement to form layers. Each layer is held by the alignment of guides and rollers, substantially perpendicular or other controlled angle of incidence, to the path of trajectory of the high-energy particles, to produce tracks. Preferably, the flexing means comprises conveying means to power and guide the workpiece through the rollers or guides. Each area of the workpiece sequentially experiences substantially the same environment as it moves through the rollers and guides.

One embodiment of the method features a step of forming layers wherein the strip is flexed to form a roll. The exposure step comprises rotation of the roll within the path of the high-energy particles to produce tracks.

Rotation of the roll allows a substantially uniform distribution of high-energy particles throughout the roll, forming a uniform pattern of perforations and tracks.

A further embodiment of the present invention features an apparatus for use in conjunction with a source of high-energy particles for forming a plurality of tracks in a flexible workpiece for each high-energy particle. The apparatus comprises means for receiving a flexed workpiece in a position in the path of trajectory of said high-energy particles. Such flexed workpiece traversing the path of trajectory two or more times to allow the high-energy particle to form a plurality of tracks.

Preferably, the workpiece is a film or foil. A preferred film is a polymer including, by way of example without limitation, polyethylenes such as polyethylene terephthalate and polyolefins, polystyrenes, polysulfones, vinyl plastics, polycarbonates, aromatic polyethers and cellulose esters such as nitrate, acetate and bytrates.

One embodiment of the present apparatus features rollers or guides arranged in a festoon configuration arrangement to allow the flexible workpiece, preferably a strip of plastic, to be flexed in a serpentine manner to form a plurality of layers. Each layer crosses the path of trajectory of the high-energy changed particles.

One embodiment features rollers and guides which hold each layer of the workpiece perpendicular to the path of trajectory of the high-energy particles as each layer crosses the path to form substantially parallel tracks.

1. In the situation where the guides and rollers hold each layer in a substantially perpendicular alignment to the path of trajectory of the high-energy particles, substantially parallel tracts are formed. However, as the particle density on each layer increases, parallel tracts may give rise to particles impinging upon substantially the same tract creating holes of nonstandard size. For applications involving work pieces which will be subjected to a high density of high-energy particles, it is useful to vary the incidence of angle with each layer. Thus, each particle traverses through the layer along a different path. Although such paths may intersect at some point, each point will diverge. Because the diverging paths maintain a minimum for size for each path.

2. A further embodiment features rollers and guides which hold each layer of the workpiece at a different angle with respect to the path of trajectory. Holding each layer at a different angle alters the angle of incidence of the high-energy particle, making the probability that two particles will pass through the membrane on similar tracks remote. High energy particles which travel similar tracks tend to create one channel, which channel has a larger diameter than tracks made by a single particle. Thus, altering the angle of the workpiece with respect to the path of trajectory produces a workpiece with pores of more uniform size.

Preferably, the apparatus includes conveying means to power the workpiece through the festooning arrangement of rollers and guide surfaces.

The festooning arrangement of rollers and guide surfaces exposes each part of the workpiece to similar conditions as it moves through substantially all of the workpiece and is subjected to a first path of the high-energy particle and each subsequent path of the high-energy particle as if it passes through each layer. Each area of the workpiece as it moves through the rollers and guide surfaces, will form part of each layer.

Thus, embodiments of the present invention provides methods and apparatus to produce a plurality of tracks with a single high-energy charged particle. The plurality of tracks allow films and foils to have a greater track density for a defined source of high-energy charged particles. The equipment is simplified in the sense that an individual area of the workpiece does not have to be positioned and does not require as many changes in positions to achieve a particular density with respect to a source of charged particles. Each area of the workpiece is subjected to uniform processes and provides a more uniform track density over the entire area of the workpiece. The features of the present invention provide for substantial cost reduction by maximizing the number of tracks that can be produced with a single-charged particle.

These features and others will be apparent to individuals skilled in the art from the following description with reference to the accompanying drawings, which by way of illustration, depict preferred embodiments of the present invention.

DETAILED DESCRIPTION OF THE DRAWINGS

The present invention is described in detail as a method and apparatus for forming a plurality of tracks in a flexible workpiece with a high-energy particle traveling on a path of trajectory, with the understanding that the disclosure is to be considered an exemplification of the principles of the invention, and it is not intended to limit the invention to the embodiments illustrated.

The apparatus and methods of the present invention are described herein with respect to a source of high-energy particles. The source of high-energy particles may include, but is not limited to high-energy particles emitted through nuclear fission reactions and accelerators. Embodiments of the present invention have particular value when used in conjunction with accelerators in that they utilize each high-energy charged particle in an efficient manner.

Individuals skilled in the art are knowledgable about the operation and construction of accelerators and such details will not be presented herein. Rather, the focus of the present description will be on apparatus and methods which utilize high-energy particle emissions of accelerators to produce tracks in a workpiece.

Embodiments of the present invention will be described in the context of a accelerator capable of producing high-energy charged particles. By way of example, Van de Graaf accelerators and Tandem accelerators typically produce particles having energies of approximately 100 KeV to 10 MeV. Cyclotrons and linear rf accelerators typically produce particles having energies of approximately 100 MeV to 1 GeV. Synchrotrons may produce particles having even higher energies. Many accelerators are capable of producing $10^6$ to $10^{13}$ high-energy charged particles each second.

Figure 1:
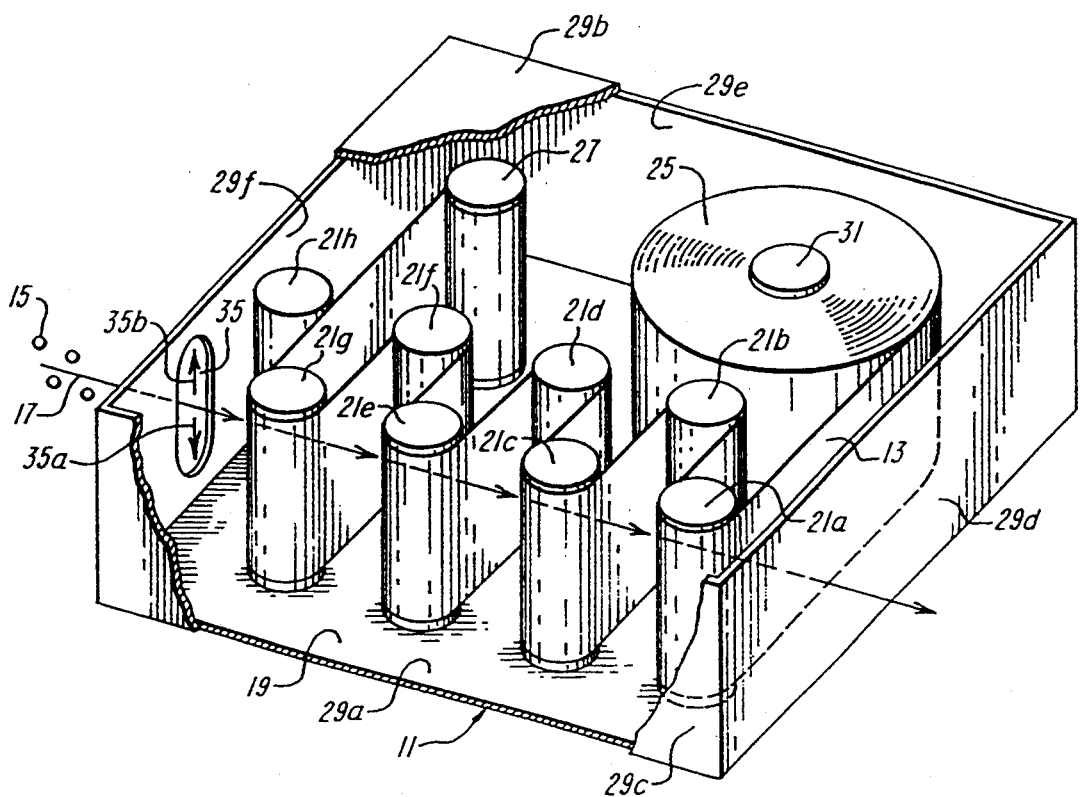
FIG. 1 is a top, perspective view, in section, illustrating an apparatus for forming a plurality of tracks in a flexible workpiece with a high-energy particle traveling on a path of trajectory, which embodiment features flexing means adapted to convey the workpiece in a festoon arrangement through the path of trajectory.

Turning now to FIG. 1, a workpiece flexing device 11 for forming multiple tracks in a flexible workpiece 13 is illustrated. As described herein, flexible workpiece 13 is a strip of plastic capable of being bombarded by high-energy charged particles 15. The high-energy charged particles travel a path of trajectory represented by arrow 17.

The flexing device 11 is comprised of the following major elements: a housing 19, flexing means in the form of flexing rollers 21(a)–21(h), a supply of the workpiece 13 in the form of roll 25, and a take up reel 27. Housing 19 provides support for rollers 21(a)–21(h), and is capable of receiving or storing material to be processed.

The dimensions and shape of housing 19 are not a critical feature of the present invention. Housing 19 is shaped and sized to function in the context of a accelerator, with consideration to the volume of material which housing 19 will hold. Suitable accelerators include Tendem, Van de Graaf, Cyclotron, and linear rf accelerators. Synchrotrons are also suitable; however, the high cost of operating the Synchrotron may not be as advantageous as other sources of high-energy particles. For the purpose of the present application, housing 19 will be described as a rectangular box-like structure, having a bottom 29a, top 29b (shown in cutaway), and four side walls 29c–f.

The device 11 can be operated within the vacuum of a accelerator, or housing 19 may communicate with suitable pumps (not shown), if necessary, to maintain the interior of housing 19 substantially free of atmosphere. Housing 19 supports a roll 25 received on spindle 31 allowing material 13 to be withdrawn.

Housing 19 is in communication with an accelerator through opening 35 in wall 29f. Opening 35 allows high-energy particles 15 traveling along the trajectory path 17 to enter and impinge upon the workpiece 13.

Rollers 21(a)–21(h) are arranged within the housing 19 to carry the workpiece 13 in a festoon or serpentine configuration. As can be most clearly seen in FIG. 2, the serpentine or festoon configuration of the rollers 21(a)–21(h) forms a plurality of layers 33a–33h traversing the path of trajectory 17.

Each high-energy charged particle is capable of traveling through each of the layers 33a–33h to produce a track or aperture. Each high-energy charged particle is capable of producing eight tracks in material 13. The rollers 21(a)–21(h) direct the workpiece 13 perpendicular to the path of trajectory 17, such that as the workpiece 13 is flattened along its length, all tracks are substantially parallel. However, for some applications, particularly in filters as separation membranes, parallel tracks may increase the probability that more than one particle will pass through the workpiece within overlapping radii of the particles. The overlapping of the radii produce openings of nonuniform size. One embodiment of the present invention features rollers 21(a)–21(h) which direct the workpiece 13 at a different angle with respect to the path of trajectory at each of the layers 33(a)–33(h). Although particles may take paths which intersect, such paths will diverge due to the different angles.

Individuals skilled in the art will readily recognize that rollers 21(a)–21(h) may be substituted with appropriate guide surfaces.

The number of layers, which can be efficiently bombarded with a beam of high-energy charged particles 15, is dependent on the features of the material comprising workpiece 13, the size of the particles, and the energy of the particles 15. The greater the energy, or smaller the size, the greater the number of layers 33a–33h which can be penetrated.

Workpiece 13 comprises a strip of plastic carried on roll 25 which strip has a width dimension of approximately 20 centimeters, a thickness dimension of up to approximately 60 $\mu$m. The length of the workpiece is limited only by the storage capacity of roll 25 or other storage means. Individuals skilled in the art will readily recognize that workpiece 13 may be supplied to rollers 21(a)–21(h) from any number of storage means from within the housing 19 or from without.

Workpiece 13 from roll 25 is received by rollers 21(a)–21(h) and brought to take-up roller 27. Preferably, take-up roller 27 is powered by power means (not shown) to draw the workpiece 13 from roll 25 through about 21(a)–21(h).

Device 11 can be an integral part of an accelerator. Device 11 may also be in the form of a cassette capable of being positioned in communication with a particle beam of an accelerator, and readily removed upon the exhaustion of workpiece 13 from roll 25, to be replaced with a second cassette. Such cassettes can be exchanged with less effort and in less time than rethreading a workpiece 13 through rollers 21(a)–21(h).

Individuals skilled in the art will readily recognize that the trajectory 17 of particles 15 can be altered by scanning controls (not shown). The scanning controls allow the particles to be directed in a beam-like fashion across the width of the workpiece 13 as illustrated by arrows 35a and 35b. Thus, as workpiece 13 is moved through rollers 21(a)–21(h) in the direction of one axis, scanning controls move the beam about the other axis.

Preferably, the amplitude of the scan exceeds the dimensions of the workpiece 13. Thus, as the scan changes directions along the axis upon which it moves, workpiece 13 moves along its axis to avoid a greater density of particles 15 along the edge.

Workpiece 13 moves through rollers 21(a)–21(h) at a rate dependent on the desired porosity as the workpiece 13 is scanned across its width at x times per second, to produce a substantially even distribution of tracks.

Figure 2:
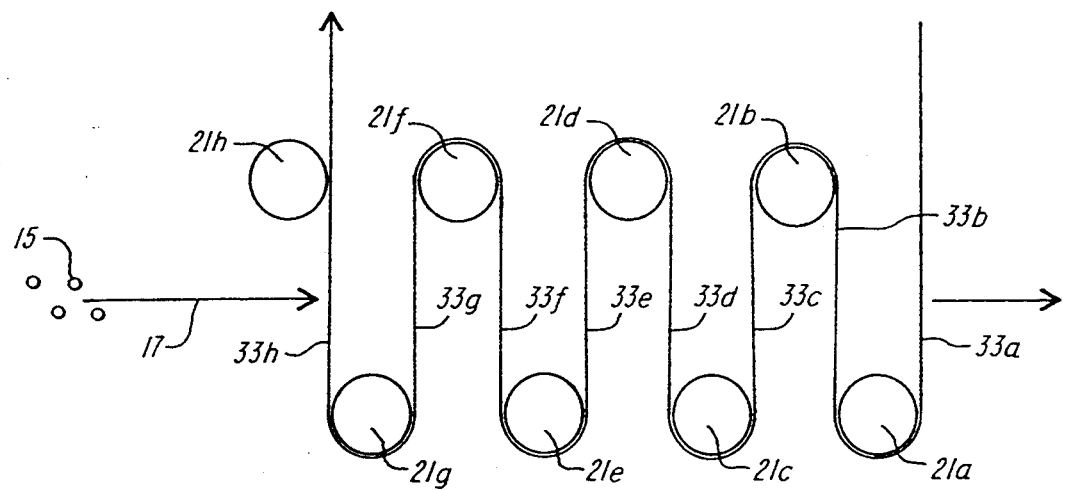
FIG. 2 is a diagrammatic top view of a festooning arrangement of rollers.

In operation, workpiece 13, carried on roll 25, is drawn through rollers 21(a)–21(h) in a festoon arrangement and onto take-up reel 27. Rollers 21(a)–21(h) flex the workpiece forming layers 33(a)–33(h), each layer 33(a)–33(h) held in the path of trajectory 17 of particles 15. Each particle 15 produces a track (not shown) in each layer 33(a)–33(h) of the workpiece 13. Workpiece 13, flattened along its length, has a plurality of tracks for each particle 15. Turning noe to FIG. 2, substantially parallel tracks formed in the workpiece 13 in the event rollers 21(a)–21(h) hold each layer 33(a)–33(h) perpendicular to the path of trajectory 17 or particles 15. Non-parallel tracks are formed if the angle of incidence of the path of trajectory 17 of particles 15 is varied for each larger 33(a)–33(h).

As the workpiece 13 is moved through rollers 21(a)–21(h) about one axis, scanning controls move the beam of particles 15 about the other axis as illustrated by arrows 35(a) and 35(b) to distribute particles 15 in a substantially uniform manner along the length and width of the workpiece 13.

Figure 3:
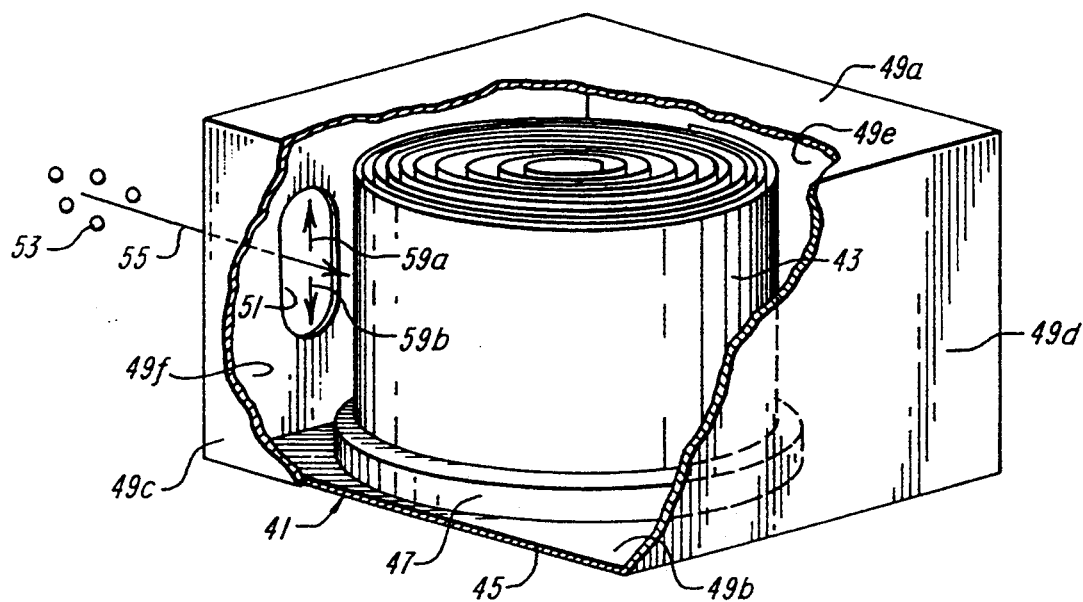
FIG. 3 is a side view, in section of an apparatus for forming a plurality of tracks in a flexible workpiece with a high-energy particle traveling on a path of trajectory, which apparatus features a flexible workpiece in rolled configuration positioned on a turntable in the path of trajectory to allow the high-energy particles to form a plurality of tracks.

Turning now to FIG. 3, an alternate embodiment of the present invention features a device, generally designated by numeral 41, for forming a plurality of tracks in a flexible workpiece 43 is illustrated. The device 41 is comprised of the following major components: a housing 45 and a turntable 47 adapted to receive a rolled workpiece 43.

As with the previous embodiment, the dimensions and shape of housing 45 are not a critical feature of the present invention. Housing 45 is shaped and sized to function in the context of an accelerator with consideration to the volume of workpiece 43 flexed in a rolled configuration. For the purpose of the present application, housing 19 will be described as a rectangular box-like structure having a bottom 49a, top 49b and four sides 49c–f.

The device 41 can be operated within the vacuum of an accelerator, or housing 45 may communicate with pumps (not shown), if necessary, to maintain the interior of housing 45 substantially free of atmosphere.

Housing 45 is in communication with an accelerator through opening 51 to allow high-energy charged particles 53 traveling along a trajectory 55 to enter and impinge upon workpiece 43.

Figure 4:
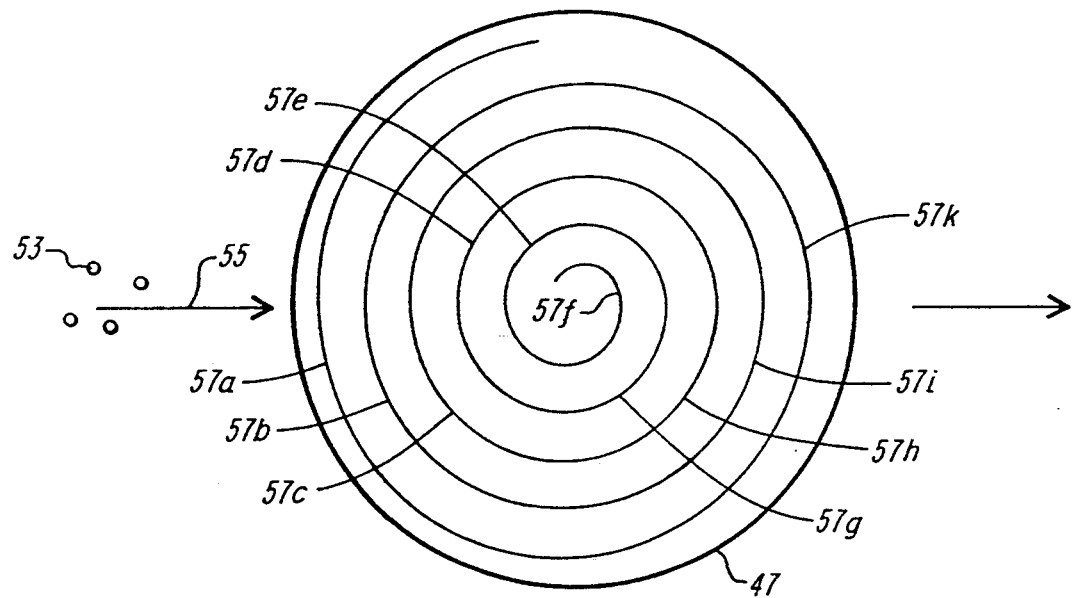
FIG. 4 is a diagrammatic top view of a roll of material on a turntable.

Turntable 47 receives and carries a rolled workpiece 43 held within the trajectory path 55 of particles 53. Workpiece 43 comprises a foil or film. Workpiece 43 has a rolled configuration which creates layers 57(a)–57(j) best viewed in FIG. 4. For purposes of this discussion, the width dimension of the workpiece and the space between layers is not drawn to scale. Workpiece 45 is preferably compactly rolled to provide 30 layers about the circumference of roll. Each of the layers 57(a)–57(j) cross the path of trajectory 55. Each particle 53 is capable of traveling through each of the layers 57(a)–57(j) of rolled workpiece 43 to produce a track (not shown). As illustrated, each particle 53 is capable of producing ten tracks.

One embodiment of the present invention features a turntable 47 which holds rolled workpiece 43 in a position where each layer 57(a)–57(j) is substantially perpendicular to the path of trajectory 55. As the workpiece 43 is flattened along its length, all tracks are substantially parallel.

The number of layers 57(a)–57(j) which can be efficiently bombarded with a beam of high-energy charge particles 53 is dependent on the features of the material comprising workpiece 43, the size of the particle 53, and the energy of the particles 53. The greater the energy or the smaller the size, the greater number of layers 57(a)–57(j), which can be formed into workpiece 43. Rotation of turntable 47 allows all parts of the workpiece 43 to be bombarded by particles 51. Preferably, turntable 47 is rotated by power means (not shown) such as an electric motor.

The rolled workpiece 43 comprises a flexible strip of plastic having a width dimension of 20 centimeters, a thickness of up to approximately 60 $\mu$m. The length of the workpiece is limited only by the storage capacity of turntable 47 and housing Generally, the workpiece 43 can be rolled to form approximately 30 layers. Thus, each high-energy particle 53 will produce approximately 30 tracks.

Device 41 can be an integral part of an accelerator (not shown). Device 41 may also be in the form of a cassette capable of being positioned in communication with a particle beam of an accelerator, and readily removed upon the exhaustion of workpiece 43, to be replaced by a second cassette. Such cassettes can be exchanged with less effort and in less time than rolling and positioning a workpiece 43 or turntable 47.

As with the previous embodiment, the trajectory 55 of particles 53 can be altered by scanning controls (not shown). The scanning controls move the beam of particles about one axis, as illustrated by arrows 59(a) and 59(b) as the workpiece moves about the other on turntable 47. Preferably, the scan exceeds the width of workpiece 43 to allow the workpiece 43 to rotate as the direction of the scan is changed.

In operation, particles 53 are directed by a scanning device (not shown) capable of directing the particles across the width of the workpiece 43. Workpiece 43 is rotated by turntable 47 and scanned along its width. The revolutions of the turntable 43 and the scanning rate will be coordinated with the desired porosity of the workpiece 43. A uniformly tracked material is produced at a rate of 30 times faster than by single layer impingement.

Embodiments of the present invention provide for a substantially even track distribution throughout the length of a strip of film or foil. Embodiments of the present invention are suitable for continuous or batch processing of materials and can be easily automated. Materials processed to form tracks in accordance with the present invention are capable of further processing including etching. Materials made in accordance with the present invention are suitable for use as molecular sieves and filters.

While preferred embodiments of the invention have been described, the present invention is capable of variation and modification and, therefore, the present invention cannot be limited to the precise details set forth, but should include such changes and alterations as fall within the purview of the following claims.

What is claimed is:

1. A method of forming a track etched membrane with a high-energy charged particle traveling on a path of trajectory, which tracks are capable of being acted upon by an etchant, comprising the steps of: placing a cartridge in cooperation with a source of high energy particles, said cartridge comprising a housing enclosing means for flexing a workpiece and a workpiece, said flexing means for flexing said workpiece to form at least two layers, each layer traversing said path of trajectory at a different angle, and exposing the layers to a high-energy charged particle to allow said high-energy charged particle to form a track in each layer, which track in one layer is non-parallel with respect to said track in said other layer as said workpiece assumes a non-flexed position; removing said cartridge to allow a second cartridge to be placed in cooperation with said source of high-energy charged particles; and subjecting said workpiece to an etchant to produce a track etched membrane having at least two etched tracks in which the etched tracks are non-parallel.

2. The method of claim 1 wherein said workpiece is selected from the group of workpieces consisting essentially of film and foil.

3. The method of claim 1 wherein said workpiece is a strip of plastic having a composition selected from the group of compositions consisting essentially of polyethylenes, polyolefins, polystyrenes, polycarbonates, vinyl plastics, polysulfones, and cellulose esters.

4. The method of claim 1 wherein said workpiece is flexed to form a roll, having at least two layers, each of said layers traversing said path of trajectory as the workpiece is exposed to high-energy charged particles.

5. The method of claim 4 wherein said roll is rotating as said workpiece is exposed to high-energy charged particles.

6. The method of claim 1 wherein said workpiece is flexed on flexing means to form at least two layers, each layer traversing said path or trajectory.

7. The method of claim 6 wherein said flexing means includes rollers adapted to receive said workpiece, said workpiece traversing said path two or more times.

8. The method of claim 7 wherein said flexing means comprises conveying means to power said workpiece through said roller means.

9. There method of claim 6 wherein said flexing means includes guides adapted to receive said workpiece, said workpiece traversing said path two or more times.

10. The method of claim 9 wherein said flexing means comprises conveying means to power said workpiece through said guides as said workpiece receives a plurality of high-energy particles.

11. The method of claim 6 wherein said flexing means holds said workpiece in a festoon configuration.

12. An apparatus, for forming a plurality of tracks in a flexible workpiece with a high-energy charged particle traveling on a path of trajectory emanating from a source of high-energy charged particles, comprising a housing and flexing means, said housing adapted to assume a first position in cooperation with said source of high energy charged particles and a second position apart from said source of high-energy charged particles, said housing supporting and containing said flexing means and said workpiece, and capable of receiving said high-energy charged particle from said source of high-energy charged particles, said flexing means capable of receiving said workpiece and flexing said workpiece to form at least two layers, each layer traversing said path of trajectory at a different angle to allow said high-energy charged particle to form a track in each layer which track from one layer is non-parallel to the track from said other layer as said workpiece assumes a non-flexed position, said housing assuming said second position apart from said source of high-energy charged particles upon exhausting said workpiece to allow a second housing to assume said first position with respect to said source of high-energy charged particles.

13. The apparatus of claim 12 wherein said flexing means is capable of receiving a workpiece selected from the group of workpieces consisting essentially of film and foil.

14. The apparatus of claim 13 wherein said workpiece is a strip of plastic having a composition selected from the group of compositions consisting essentially of polyethylenes, polyolefins, polystyrenes, polycarbonates, vinyl plastics, polysulfones and cellulose esters.

15. The apparatus of claim 12 wherein said flexing means comprises rollers adapted to receive said workpiece and flex said workpiece to form at least two layers, each layer traversing said path of trajectory.

16. The apparatus of claim 15 wherein said layers are perpendicular to said path of trajectory.

17. The apparatus of claim 12 wherein said flexing means comprises guides adapted to receive said workpiece and flex said workpiece to form at least two layers, each layer traversing said path of trajectory.

18. The apparatus of claim 17 wherein said layers are perpendicular to said path.

19. The apparatus of claim 17 where each of said layers crosses said path of trajectory at a different angle.

20. The apparatus of claim 12 further comprising conveying means to power said workpiece through said flexing means, as said workpiece receives a plurality of high-energy charged particles.

21. The apparatus of claim 12 wherein said flexing means holds said workpiece in a festoon configuration.

22. The apparatus of claim 12 further comprising workpiece takeoff means and workpiece receiving means, said workpiece takeoff means feeding said workpiece to said flexing means and said workpiece receiving said means receiving said workpiece from said flexing means, said workpiece take off means and workpiece receiving means supported and contained within said housing to allow said housing to be removed from said source of high-energy charged particles upon exhaustion of the workpiece.

23. An apparatus for forming a plurality of tracks in a flexible workpiece with a high-energy charged particle traveling on a path of trajectory emanating from a source of high-energy charged particles which tracks are capable of receiving etchants, comprising a housing and a turntable, said with said source of high-energy charged particles and a second position removed from said source, said housing supporting and containing said turntable in a position to receive said high-energy charged particles from said source, said turntable capable of receiving a workpiece flexed in a roll-like configuration having a circumference, to form at least two layers, each said layer traversing said trajectory at a different angle with respect to said path, said turntable for holding said workpiece in said roll-like configuration in said path, to allow said high-energy charged particles to form a track in each layer, said turntable capable of rotation to allow said workpiece in said roll-like configuration to receive a plurality of high-energy charged particles about the circumference to form a plurality of tracks, which tracks formed in one layer are non-parallel with tracks formed in another layer as said workpiece assumes a non-flexed position, said housing upon exhaustion of said workpiece for being placed in said second position to allow a second housing to assure said first position with respect to said source of high-energy charged particles.

* * * * *